(12) United States Patent
Pendharkar et al.

(10) Patent No.: US 9,553,151 B2
(45) Date of Patent: Jan. 24, 2017

(54) III-NITRIDE DEVICE AND METHOD HAVING A GATE ISOLATING STRUCTURE

(71) Applicant: Texas Instruments Incorporated, Dallas, TX (US)

(72) Inventors: Sameer Pendharkar, Allen, TX (US); Naveen Tipirneni, Plano, TX (US); Jungwoo Joh, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/731,744

(22) Filed: Jun. 5, 2015

(65) Prior Publication Data

US 2015/0270357 A1 Sep. 24, 2015

Related U.S. Application Data

(63) Continuation of application No. 13/886,429, filed on May 3, 2013, now Pat. No. 9,054,027.

(51) Int. Cl.
| | |
|---|---|
| H01L 29/15 | (2006.01) |
| H01L 29/20 | (2006.01) |
| H01L 29/417 | (2006.01) |
| H01L 29/423 | (2006.01) |
| H01L 29/66 | (2006.01) |
| H01L 29/778 | (2006.01) |
| H01L 27/085 | (2006.01) |

(52) U.S. Cl.
CPC ......... *H01L 29/2003* (2013.01); *H01L 27/085* (2013.01); *H01L 29/41725* (2013.01); *H01L 29/42316* (2013.01); *H01L 29/66431* (2013.01); *H01L 29/66462* (2013.01); *H01L 29/778* (2013.01); *H01L 29/7787* (2013.01)

(58) Field of Classification Search
CPC .............. H01L 29/2003; H01L 29/205; H01L 29/66462; H01L 29/7787; H01L 2924/00014
USPC ............................................ 257/76; 438/294
See application file for complete search history.

(56) References Cited

U.S. PATENT DOCUMENTS

| | | | |
|---|---|---|---|
| 7,498,618 B2 * | 3/2009 | Saito | ................ H01L 29/42316 257/194 |
| 8,384,129 B2 | 2/2013 | Kub et al. | |
| 8,389,977 B2 | 3/2013 | Chu et al. | |
| 8,759,879 B1 | 6/2014 | Tipirneni et al. | |
| 2003/0102482 A1 | 6/2003 | Saxler | |
| 2010/0102327 A1 | 4/2010 | Standing | |
| 2012/0193677 A1 | 8/2012 | Parikh et al. | |
| 2013/0087803 A1 | 4/2013 | Kizilyalli et al. | |

* cited by examiner

*Primary Examiner* — Andy Huynh
(74) *Attorney, Agent, or Firm* — Jacqueline J. Garner; Charles A. Brill; Frank D. Cimino

(57) ABSTRACT

A semiconductor device containing a GaN FET has an isolating gate structure outside the channel area which is operable to block current in the two-dimensional electron gas between two regions of the semiconductor device. The isolating gate structure is formed concurrently with the gate of the GaN FET, and has a same structure as the gate.

20 Claims, 9 Drawing Sheets

US 9,553,151 B2

III-NITRIDE DEVICE AND METHOD HAVING A GATE ISOLATING STRUCTURE

CROSS REFERENCE TO RELATED APPLICATIONS

This application is a continuation of U.S. Nonprovisional patent application Ser. No. 13/886,429, filed May 3, 2013, the contents of which are herein incorporated by reference in its entirety.

FIELD OF THE INVENTION

This invention relates to the field of semiconductor devices. More particularly, this invention relates to gallium nitride FETs in semiconductor devices.

BACKGROUND OF THE INVENTION

Field effect transistors (FETs) made of III-N materials such as GaN exhibit desirable properties for power switches, such as high bandgaps and high thermal conductivity compared to silicon FETs. However, GaN FETs are undesirably susceptible to leakage current from the drain to the source through the two-dimensional electron gas outside the channel area.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device containing a GaN FET has an isolating gate structure outside the channel area which is operable to block current in the two-dimensional electron gas between two regions of the semiconductor device. The isolating gate structure is formed concurrently with the gate of the GaN FET, and has a same structure as the gate.

DETAILED DESCRIPTION OF EXAMPLE EMBODIMENTS

Figure 1A:
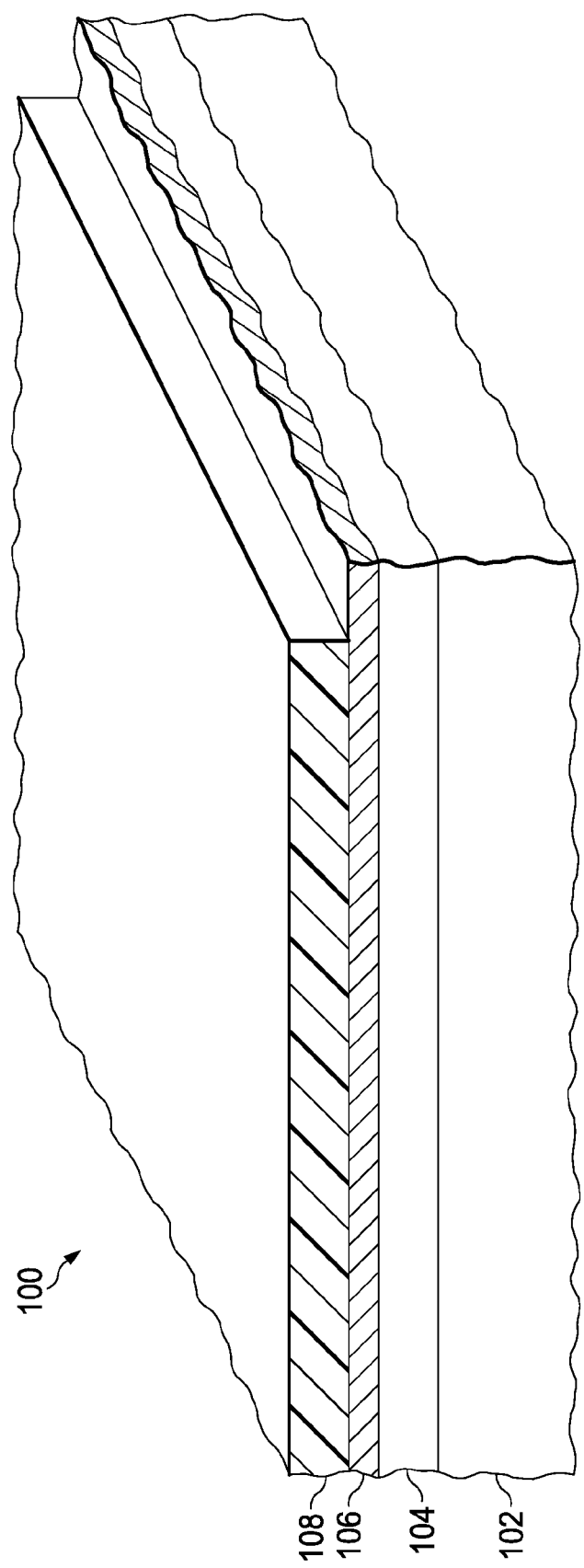
FIG. 1A through FIG. 1D are cross sections of an exemplary semiconductor device.

The following co-pending patent applications are related and hereby incorporated by reference:

U.S. patent application Ser. No. 13/886,378 (TI-71206 filed simultaneously with this application, entitled "AVALANCHE ENERGY HANDLING CAPABLE III-NITRIDE TRANSISTORS;"

U.S. patent application Ser. No. 13/886,410 (TI-71208 filed simultaneously with this application, entitled "III-NITRIDE ENHANCEMENT MODE TRANSISTORS WITH TUNABLE AND HIGH GATE-SOURCE VOLTAGE RATING;"

U.S. patent application Ser. No. 13/886,652 (TI-71492 filed simultaneously with this application, entitled "LAYER TRANSFER OF SILICON ONTO III-NITRIDE MATERIAL FOR HETEROGENOUS INTEGRATION;"

U.S. patent application Ser. No. 13/886,688 (TI-72417 filed simultaneously with this application, entitled "RESURF III-NITRIDE HEMTS;"

U.S. patent application Ser. No. 13/886,709 (TI-72418 filed simultaneously with this application, entitled "STEPPED DIELECTRIC FOR FIELD PLATE FORMATION;" and U.S. patent application Ser. No. 13/886,744 (TI-72605 filed simultaneously with this application, entitled "FET DIELECTRIC RELIABILITY ENHANCEMENT."

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device containing a GaN FET has an isolating gate structure outside the channel area which blocks current in the two-dimensional electron gas between two regions of the semiconductor device. The isolating gate structure is formed concurrently with the gate of the GaN FET.

For the purposes of this description, the term "III-N" is understood to refer to semiconductor materials in which group III elements, that is, aluminum, gallium and indium, and possibly boron, provide a portion of the atoms in the semiconductor material and nitrogen atoms provide the remainder of the atoms in the semiconductor material. Examples of III-N semiconductor materials are gallium nitride, boron gallium nitride, aluminum gallium nitride, indium nitride, and indium aluminum gallium nitride. Terms describing elemental formulas of materials do not imply a particular stoichiometry of the elements. III-N materials may be written with variable subscripts to denote a range of possible stoichiometries. For example, aluminum gallium nitride may be written as $Al_xGa_{1-x}N$ and indium aluminum gallium nitride may be written as $In_xAl_yGa_{1-x-y}N$. For the purposes of this description, the term GaN FET is understood to refer to a field effect transistor which includes III-N semiconductor materials.

FIG. 1A through FIG. 1D are cross sections of an exemplary semiconductor device. Referring to FIG. 1A, the semiconductor device 100 is formed on a substrate 102, for example, an electrical isolation layer. The electrical isolation layer may be, for example, 300 to 2000 nanometers of semi-insulating gallium nitride. The electrical isolation layer may be, for example, semi-insulating to provide a desired level of electrical isolation between layers below the electrical isolation layer and layers above the electrical isolation layer. The substrate 102 may also include, for example a silicon base wafer and an isolation layer of aluminum nitride and a buffer layer of graded $Al_xGa_{1-x}N$ between the silicon base wafer and the electrical isolation layer.

A low-defect layer 104 is formed on the electrical isolation layer of the substrate 102. The low-defect layer 104 may be, for example, 25 to 1000 nanometers of gallium nitride. The low-defect layer 104 may be formed so as to minimize crystal defects which may have an adverse effect on electron mobility, which may result in the low-defect layer 104 being doped with carbon, iron or other dopant species, for example with a doping density less than $10^{17}$ cm$^{-3}$.

A barrier layer 106 is formed on the low-defect layer 104. The barrier layer 106 may be, for example, 8 to 30 nanometers of $Al_xGa_{1-x}N$ or $In_xAl_yGa_{1-x-y}N$. A composition of group III elements in the barrier layer 234 may be, for example, 24 to 28 percent aluminum nitride and 72 to 76 percent gallium nitride. Forming the barrier layer 106 on the low-defect layer 104 generates a two-dimensional electron gas in the low-defect layer 104 just below the barrier layer 106 with an electron density of, for example, $1\times10^{12}$ to $2\times10^{13}$ cm$^{-2}$. The barrier layer 106 may include an optional cap layer, for example of gallium nitride, at a top surface of the barrier layer 106.

An isolation mask 108 is formed over the barrier layer 106 so as to expose an area of the barrier layer 106 for an isolation region. The isolation mask 108 may include, for example, 200 nanometers to 2 microns of photoresist formed by a photolithographic process.

Figure 1B:
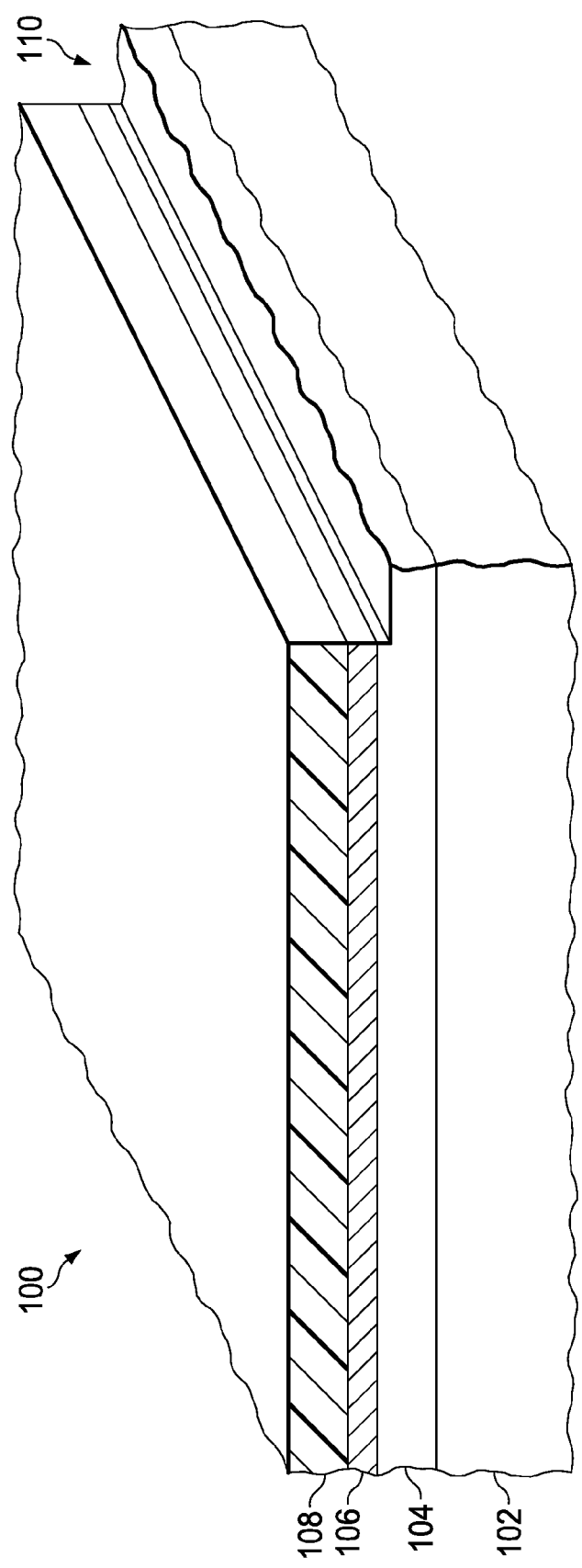

Referring to FIG. 1B, an isolation process is performed which forms an isolation region 110 in the barrier layer 106 and the low-defect layer 104, in the area exposed by the isolation mask 108. In one version of the instant example, depicted in FIG. 1B, the isolation process may be an isolation etch which removes material from the barrier layer 106 and the low-defect layer 104 so as to form an isolation trench 110. In another version of the instant example, the isolation process may be an isolation implant which implants dopants into the barrier layer 106 and the low-defect layer 104 to form a heavily doped isolation barrier. The isolation region 110 reduces or eliminates electrical current in the two-dimensional electron gas from crossing the isolation region 110. The isolation region 110 may extend across the semiconductor device 100 or may enclose a region within the semiconductor device 100. The isolation mask 108 may be removed after the isolation region 110 is formed.

Figure 1C:
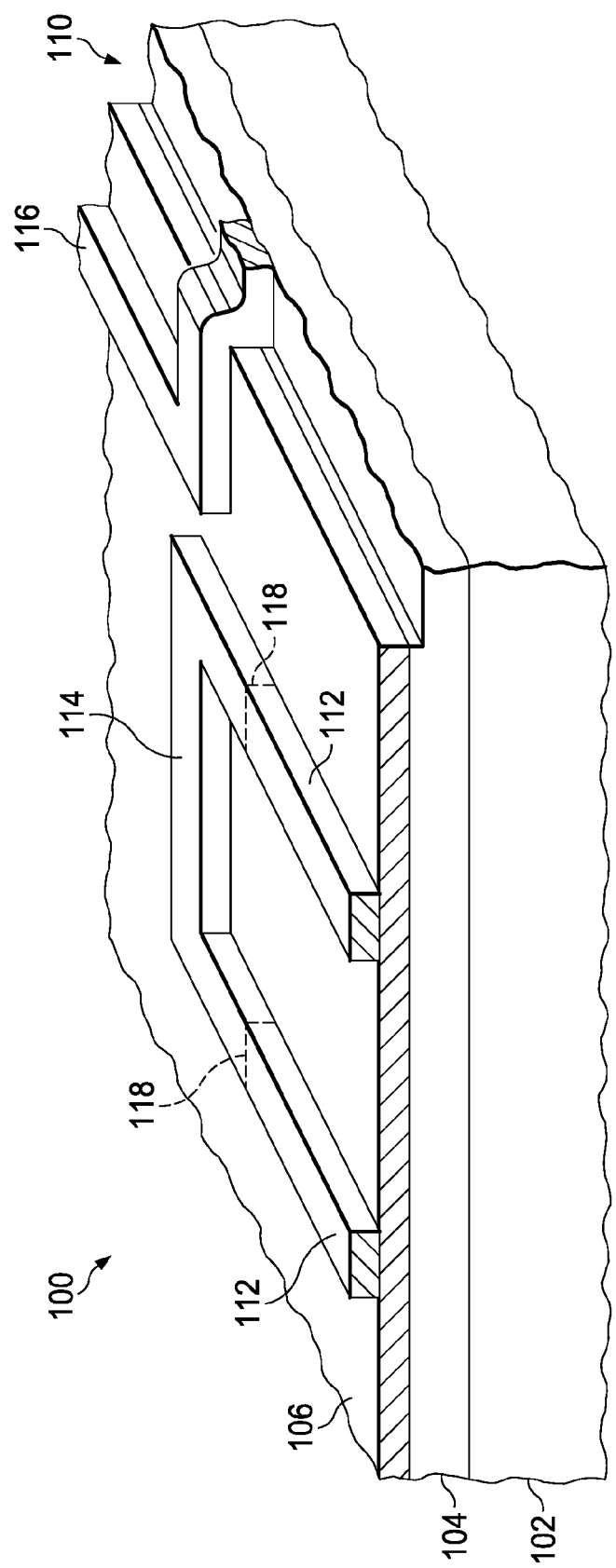

Referring to FIG. 1C, a gate formation process is performed which concurrently forms a gate 112, a first isolating gate structure 114 abutting the gate 112 and a second isolating gate structure 116 separate from the gate 112. The gate 112 and the first isolating gate structure 114 are contiguous; boundary line 118 is provided in FIG. 1C and FIG. 1D to depict their respective extents. The second isolating gate structure 116 may overlap the isolation region 110 as depicted in FIG. 1C. The first isolating gate structure 114 may also optionally overlap the isolation region 110.

The gate 112, the first isolating gate structure 114 and the second isolating gate structure 116 may be, for example, metal gate structures directly on the barrier layer 106 forming schottky junctions between the metal and the III-N material of the barrier layer 106. In another example, the gate 112, the first isolating gate structure 114 and the second isolating gate structure 116 may be insulated metal gate structures in which metal gate structures are formed on a gate dielectric layer on the barrier layer 106. In a further example, the gate 112, the first isolating gate structure 114 and the second isolating gate structure 116 may be III-N semiconductor gate structures which do not disrupt the two-dimensional electron gas unless a bias is applied to the semiconductor gate structures. In another example, the gate 112, the first isolating gate structure 114 and the second isolating gate structure 116 may be p-type III-N semiconductor gate structures which disrupt the two-dimensional electron gas when no bias is applied to the p-type semiconductor gate structures.

Figure 1D:
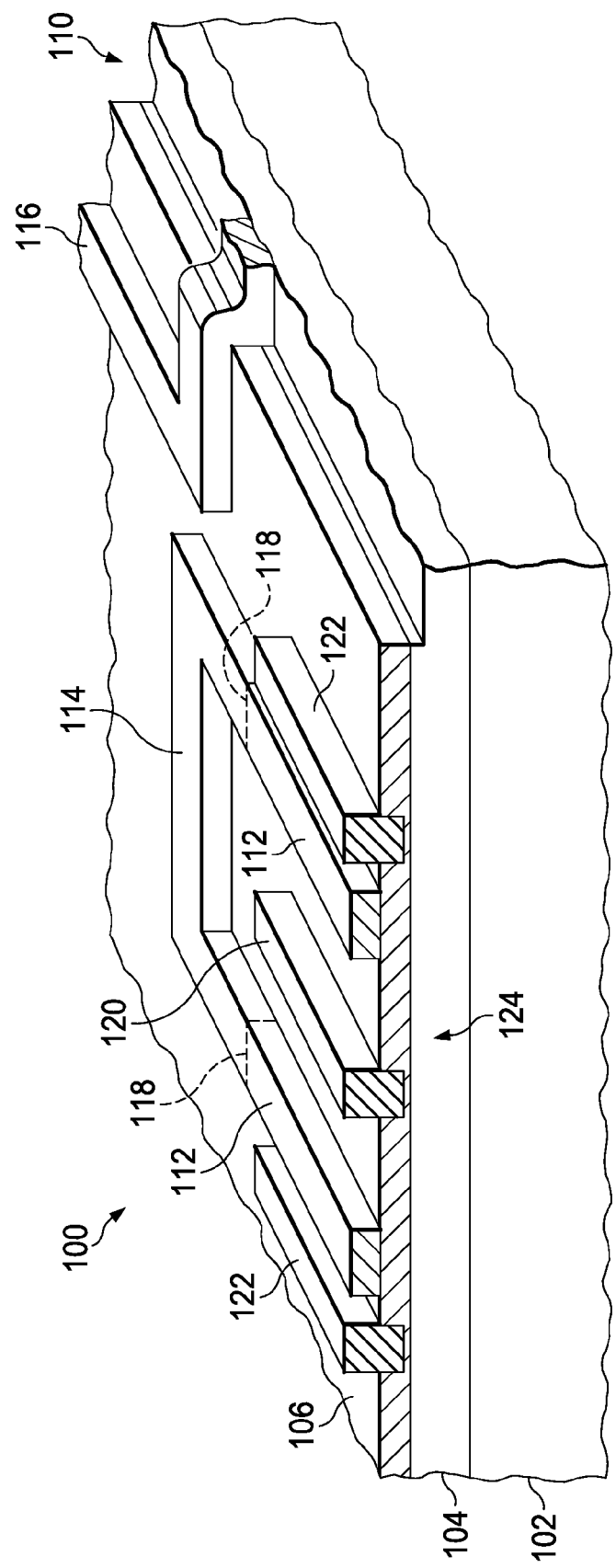

Referring to FIG. 1D, at least one drain contact 120 and at least one source contact 122 are formed in the barrier layer 106. The drain contact 120 and source contact 122 may be, for example, disposed below the top surface of the barrier layer 106 an make tunneling electrical connections to the two-dimensional electron gas in the low-defect layer 104. The gate 112, the drain contact 120 and the source contact 122 are parts of a GaN FET 124 of the semiconductor device 100.

The first isolating gate structure 114 and the second isolating gate structure 116 electrically isolate one or more regions of the two-dimensional electron gas from one another. In some types of gate structures, such as the p-type semiconductor gate structure, electrical isolation may be accomplished without applying a bias to the first and second isolating gate structures 114 and 116 relative to the barrier layer 106. In other types of gate structures, such as the semiconductor gate structure or the schottky metal gate structure, electrical isolation may be accomplished by applying a negative bias to the first and second isolating gate structures 114 and 116 relative to the barrier layer 106. In the example depicted in FIG. 1D, the two-dimensional electron gas contiguous with the drain contact 120 is electrically isolated from the two-dimensional electron gas contiguous with the source contacts 122 by the first isolating gate structure 114. Similarly, the two-dimensional electron gas contiguous with the source contacts 122 is electrically isolated from the two-dimensional electron gas on an opposite side of the second isolating gate structure 116. Field plates, not shown, may be formed adjacent to the gate to reduce electric fields in the barrier layer 106 and the low-defect layer 104. The field plates may include extensions of the gate 112 and the first isolating gate structure 114 and the second isolating gate structure 116, and may include extensions of the source contacts 122.

Figure 2:
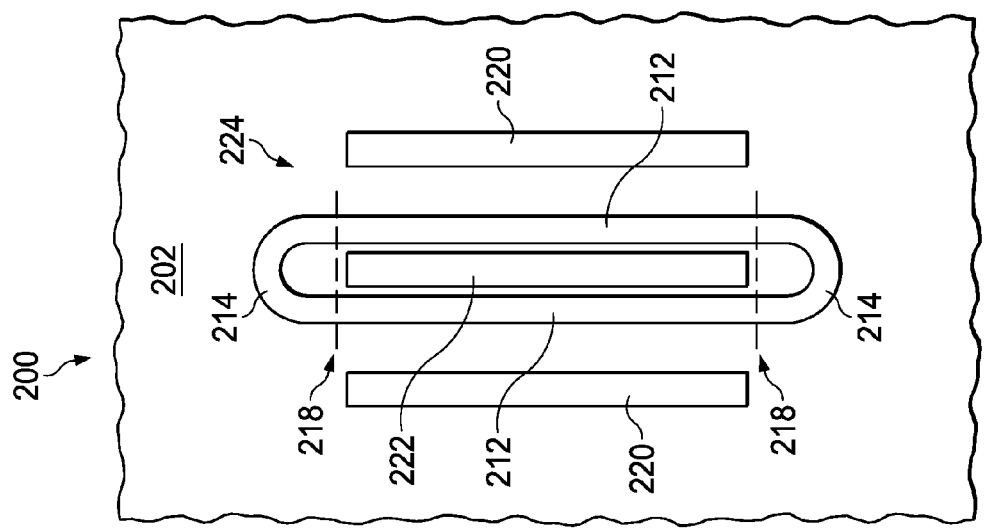

FIG. 2 through FIG. 7 are top views of semiconductor devices with exemplary configurations of isolating gate structures. Referring to FIG. 2, a semiconductor device 200 is formed in and on a substrate 202, for example as described in reference to FIG. 1A. A two-dimensional electron gas is formed in the substrate 202 by a barrier layer over an low-defect layer. A gate 212 and a gate isolating structure 214 are formed concurrently over a top surface of the substrate 202. In the instant example, the gate 212 has two parallel segments and the gate isolating structure 214 has two arced segments. The gate isolating structure 214 segments are contiguous with the gate 212 segments; boundary line 218 is provided in FIG. 2 to depict their respective extents. The gate 212 and the gate isolating structure 214 have a closed loop configuration.

Two drain contacts 220 are formed outside the closed loop of the gate 212 and the gate isolating structure 214, one on each side of the closed loop, oriented parallel to the gate 212. A source contact 222 is formed inside the closed loop of the gate 212 and the gate isolating structure 214, also oriented parallel to the gate 212. The gate 212, the drain contacts 220 and the source contact 222 are parts of a GaN FET 224 of the semiconductor device 200. In the instant example, the gate isolating structure 214 electrically isolates the two-dimensional electron gas that is contiguous with the source contact 222 from the two-dimensional electron gas that is contiguous with the drain contacts 220.

Figure 3:
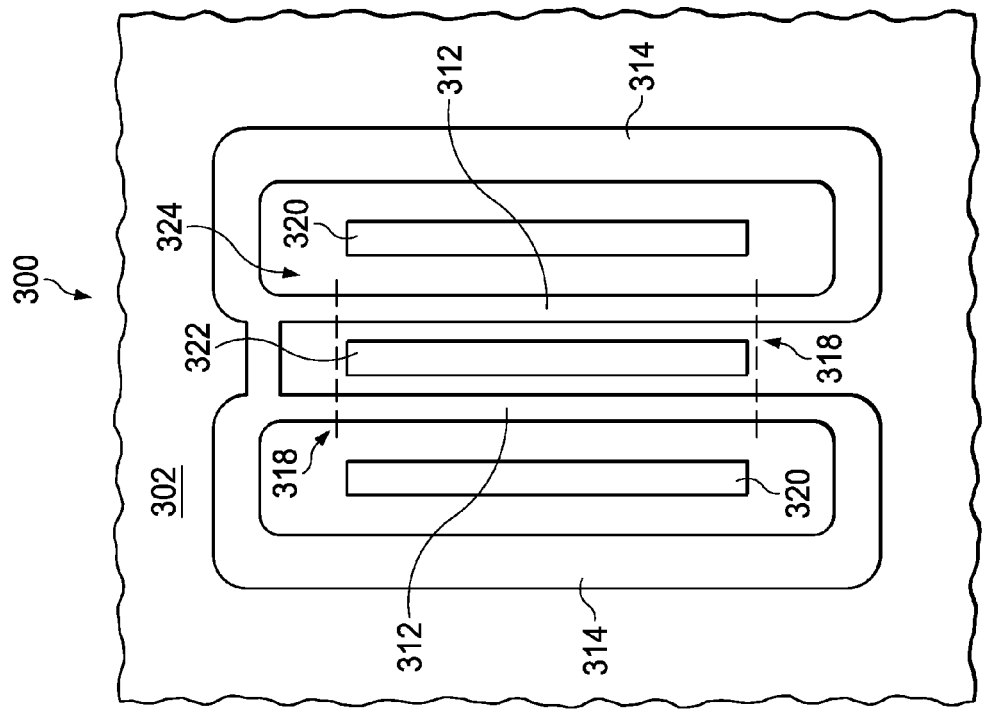
FIG. 2 through FIG. 7 are top views of semiconductor devices with exemplary configurations of isolating gate structures.

Referring to FIG. 3, a semiconductor device 300 is formed in and on a substrate 302, for example as described in reference to FIG. 1A. A two-dimensional electron gas is formed in the substrate 302 by a barrier layer over an low-defect layer. A gate 312 and a gate isolating structure 314 are formed concurrently over a top surface of the substrate 302. In the instant example, the gate 312 has two parallel segments and the gate isolating structure 314 has two C-shaped segments contiguous with the gate 312 segments; boundary line 318 is provided in FIG. 3 to depict their respective extents. The gate isolating structure 314 segments may optionally be connected by a portion of gate structure, as depicted in FIG. 3.

A source contact 322 is formed between the gate 312 segments, oriented parallel to the gate 312 segments. Two drain contacts 320 are formed adjacent to the gate 312 segments opposite the source contact 322, one on each side of the gate 312 segments. The gate 312, the drain contacts 320 and the source contact 322 are parts of a GaN FET 324 of the semiconductor device 300. The gate isolating structure 314 has two C-shaped segments connect with the gate 312 segments to form two closed loop configurations, each enclosing one of the drain contacts 320. In the instant example, the gate isolating structure 314 electrically isolates the two-dimensional electron gas that is contiguous with the drain contacts 320 from the two-dimensional electron gas that is contiguous with the source contact 322.

Figure 4:
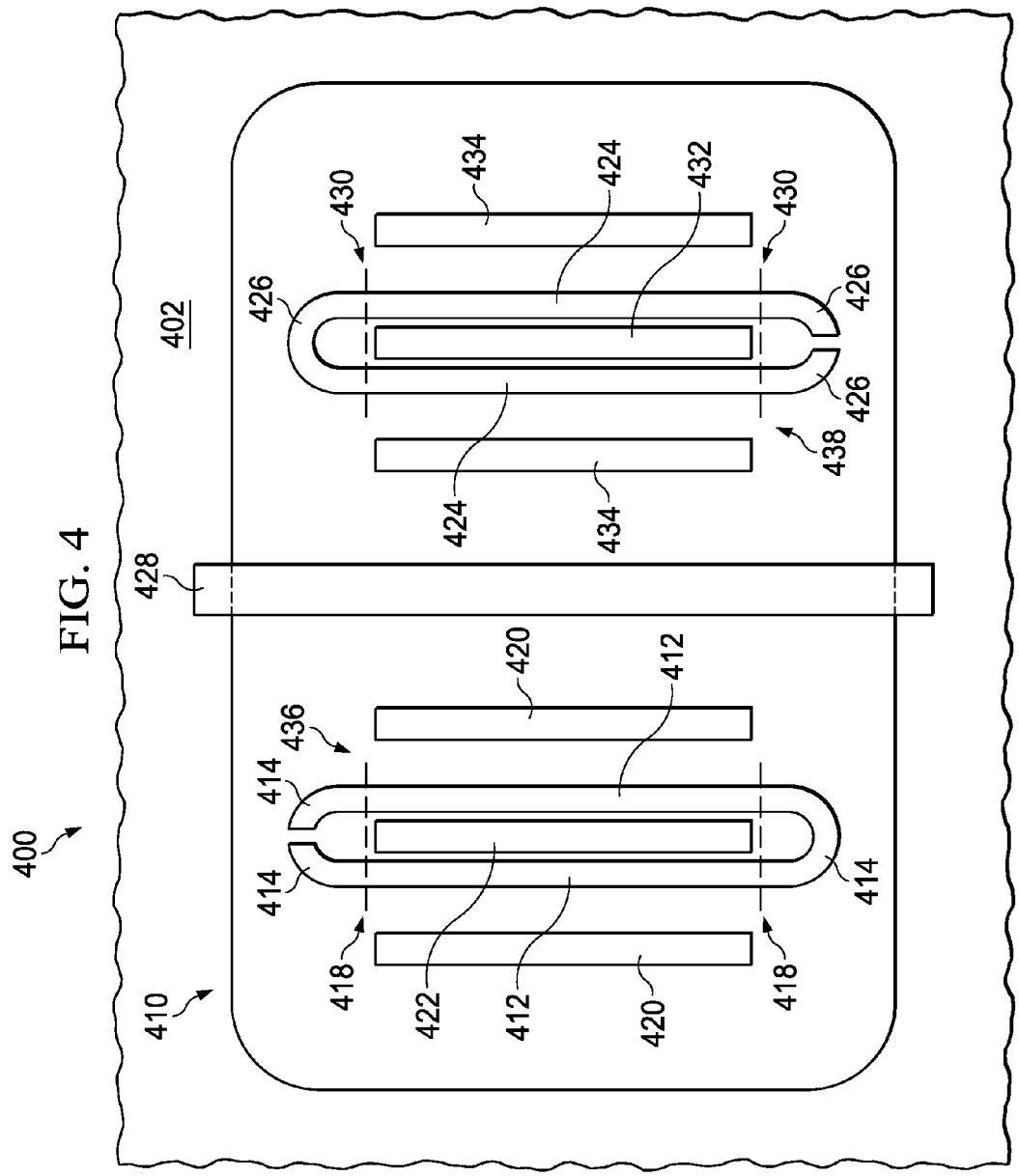

Referring to FIG. 4, a semiconductor device 400 is formed in and on a substrate 402, for example as described in reference to FIG. 1A. An isolation structure 410, for example an isolation trench structure or an isolation implanted structure, is formed as described in reference to FIG. 1A and FIG. 1B to enclose a region of the substrate 402. A two-dimensional electron gas is formed in the substrate 402 by a barrier layer over an low-defect layer.

A first gate 412, a first gate isolating structure 414, a second gate 424, a second gate isolating structure 426 and a third gate isolating structure 428 are formed concurrently over a top surface of the substrate 402. The third gate isolating structure 428 extends across the region enclosed by the isolation structure 410 and may overlap the isolation structure 410.

In the instant example, the first gate 412 has two parallel segments and the first gate isolating structure 414 has three arced segments contiguous with the first gate 412 segments; first boundary line 418 is provided in FIG. 4 to depict their respective extents. Two first drain contacts 420 are formed outside the two first gate 412 segments, one on each side of the first gate 412 segments, oriented parallel to the first gate 412 segments. A first source contact 422 is formed between the first gate 412 segments, also oriented parallel to the first gate 412 segments. The first gate 412, the first drain contacts 420 and the first source contact 422 are parts of a first GaN FET 436 of the semiconductor device 400. The three first gate isolating structure 414 arced segments and the two first gate 412 parallel segments have an open loop configuration with a narrow pinch-off region separating two of the three first gate isolating structure 414 arced segments. The two-dimensional electron gas is blocked from the narrow pinch-off region, possibly upon application of a bias to the first gate isolating structure 414. In the instant example, the first gate isolating structure 414 electrically isolates the two-dimensional electron gas that is contiguous with the first source contact 422 from the two-dimensional electron gas that is contiguous with the first drain contacts 420. Including the narrow pinch-off region may facilitate fabrication of the first gate 412 and the first gate isolating structure 414, for example using a liftoff process for metal gates.

The second gate 424 and the second gate isolating structure 426 have a similar configuration; second boundary line 430 is provided in FIG. 4 to depict their respective extents. A second source contact 432 is formed between parallel segments of the second gate 424 and second drain contacts 434 are formed outside the second gate 424. The second gate 424, the second drain contacts 434 and the second source contact 432 are parts of a second GaN FET 438 of the semiconductor device 400. The second gate isolating structure 426 electrically isolates the two-dimensional electron gas that is contiguous with the second source contact 432 from the two-dimensional electron gas that is contiguous with the second drain contacts 434. Additionally, the third gate isolating structure 428 electrically isolates the two-dimensional electron gas that is contiguous with the first drain contacts 420 from the two-dimensional electron gas that is contiguous with the second drain contacts 434. The first drain contacts 420 may advantageously be biased to a different potential than the second drain contacts 434 without incurring undesirable leakage current. In one version of the instant example, the first GaN FET 436 and the second GaN FET 438 may both be depletion mode FETs. In another version, the first GaN FET 436 and the second GaN FET 438 may both be enhancement mode FETs. In a further version, the first GaN FET 436 may be a depletion mode FET and the second GaN FET 438 may both be an enhancement mode FET.

Figure 5:
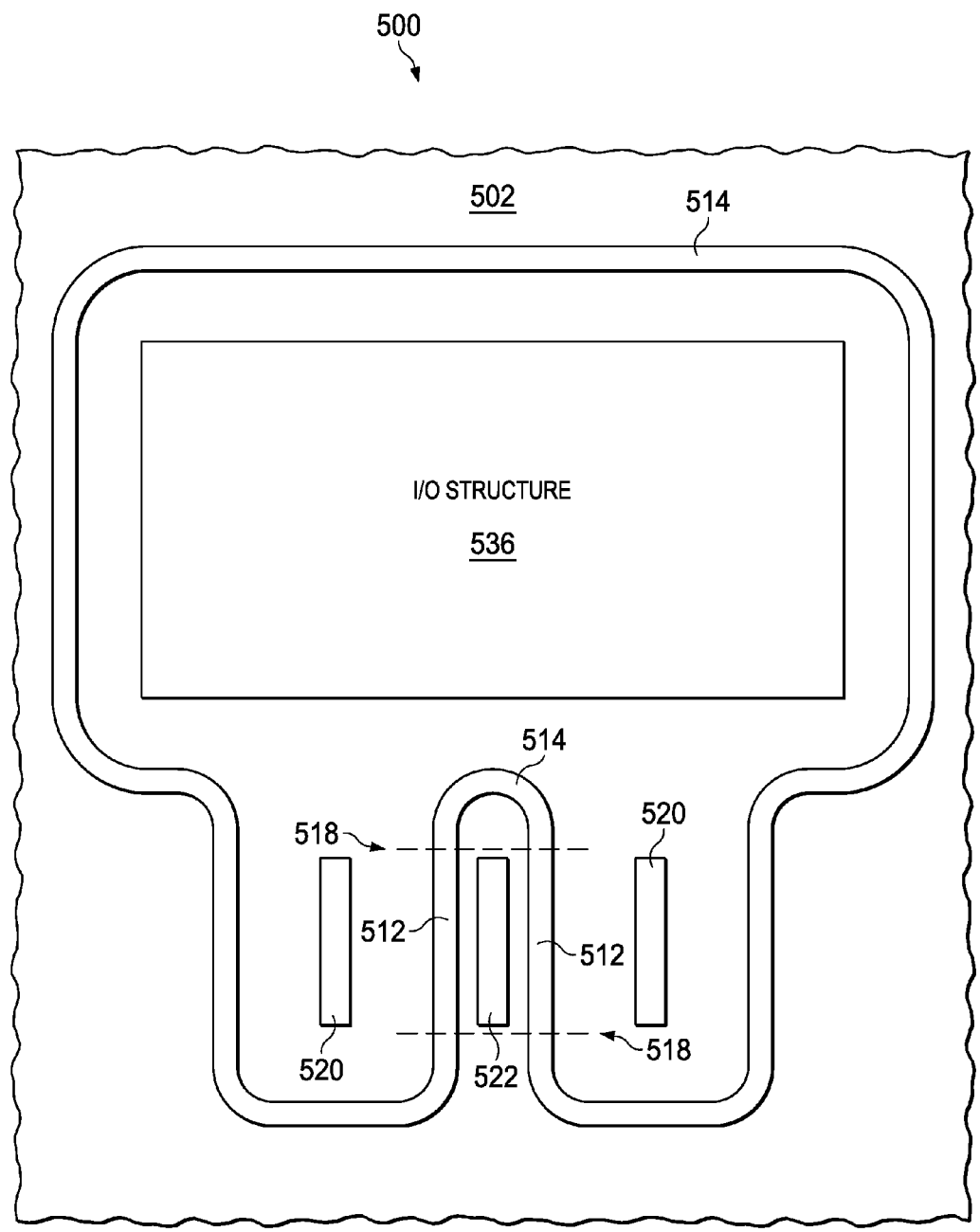

Referring to FIG. 5, a semiconductor device 500 is formed in and on a substrate 502, for example as described in reference to FIG. 1A. A two-dimensional electron gas is formed in the substrate 502 by a barrier layer over an low-defect layer. A gate 512 and a gate isolating structure 514 are formed concurrently over a top surface of the substrate 502. In the instant example, the gate 512 has two parallel segments and the gate isolating structure 514 has segments contiguous with the gate 512 segments; boundary line 518 is provided in FIG. 5 to depict their respective extents. The gate 512 and the gate isolating structure 514 form a closed loop configuration which surrounds an input/output (I/O) structure 536 and at least one drain contact 520. The I/O structure 536 may be, for example, a probe pad or a bond pad, and may be directly electrically connected to the at least one drain contact 520 or may be electrically coupled to the at least one drain contact 520 through overvoltage protection circuitry. At least one source contact 522 is formed outside the closed loop configuration of the gate 512 and the gate isolating structure 514. The source contact 522 is disposed adjacent to the gate 512 opposite the drain contacts 520. The gate 512, the source contact 522 and the drain contacts 520 are parts of a GaN FET 524 of the semiconductor device 500. In the instant example, the gate isolating structure 514 electrically isolates the two-dimensional electron gas that is contiguous with the drain contacts 520 from the two-dimensional electron gas that is contiguous with the source contact 522. Disposing the I/O structure 536 inside the closed loop configuration of the gate 512 and the gate isolating structure 514 advantageously allows biasing the drain contacts 520 without undesired leakage current from the I/O structure 536.

Figure 6:
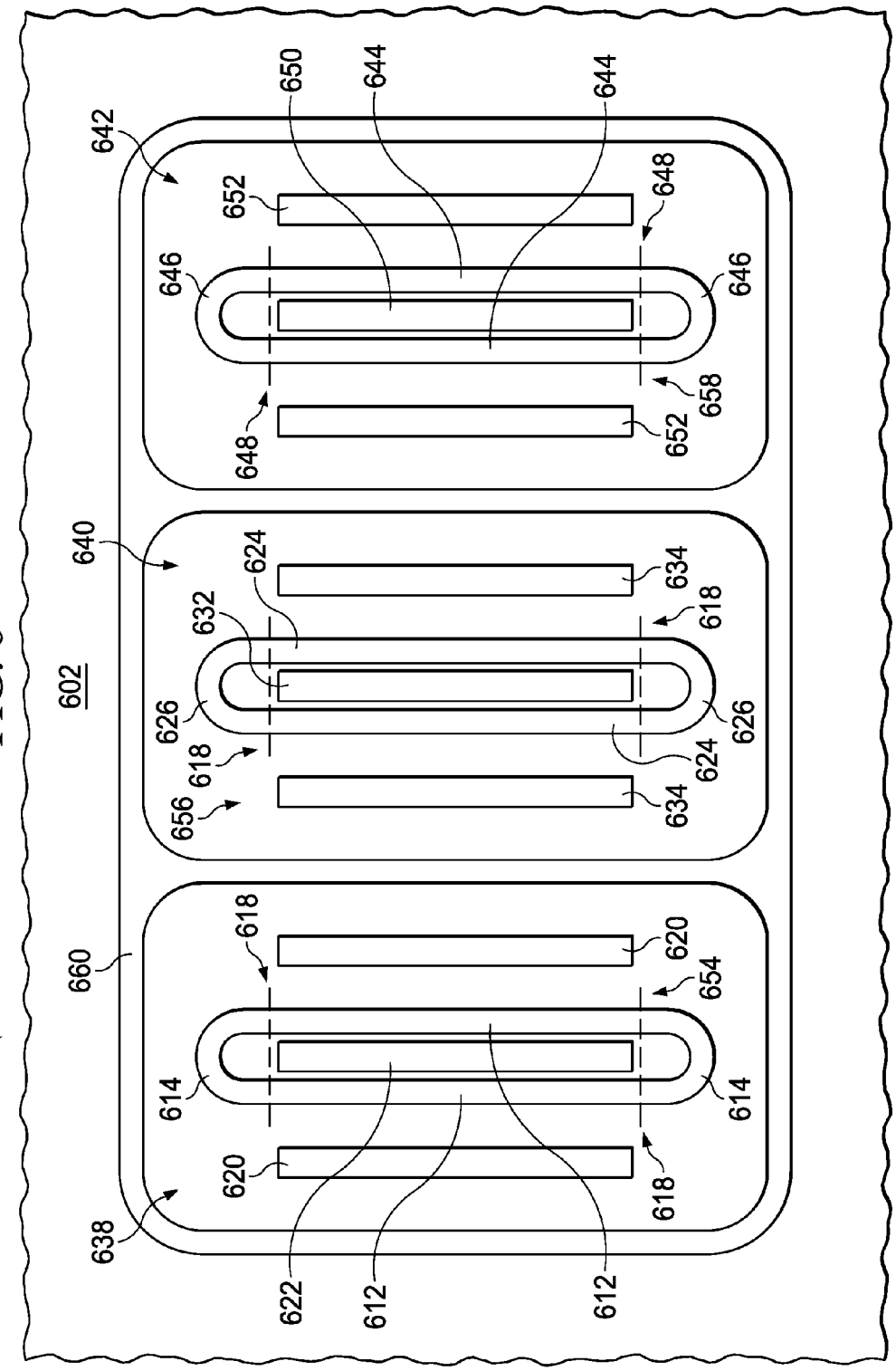

Referring to FIG. 6, a semiconductor device 600 is formed in and on a substrate 602, for example as described in reference to FIG. 1A. A two-dimensional electron gas is formed in the substrate 602 by a barrier layer over an low-defect layer. A first gate 612 and a first gate isolating structure 614, delineated by a first boundary line 618, and a first source contact 622 and first drain contacts 620 are formed, as described in reference to FIG. 2, in a first region 638 of the semiconductor device 600. The first gate 612, the first source contact 622 and the first drain contacts 620 are parts of a first GaN FET 654 of the semiconductor device 600. In the first region 638, the first gate isolating structure 614 electrically isolates the two-dimensional electron gas that is contiguous with the first source contact 622 from the two-dimensional electron gas that is contiguous with the first drain contacts 620.

In a second region 640 of the semiconductor device 600, a second gate 624 and a second gate isolating structure 626, delineated by a second boundary line 630, and a second source contact 632 and second drain contacts 634 have a similar configuration as their counterparts in the first region 638. The second gate 624, the second source contact 632 and the second drain contacts 634 are parts of a second GaN FET 656 of the semiconductor device 600. The second gate isolating structure 626 electrically isolates the two-dimensional electron gas that is contiguous with the second source contact 632 from the two-dimensional electron gas that is contiguous with the second drain contacts 634. Similarly, in a third region 642 of the semiconductor device 600, a third gate 644 and a third gate isolating structure 646, delineated by a third boundary line 648, and a third source contact 650 and third drain contacts 652 have a similar configuration as their counterparts in the first region 638. The third gate 644, the third source contact 650 and the third drain contacts 652 are parts of a third GaN FET 658 of the semiconductor device 600. The third gate isolating structure 646 electrically isolates the two-dimensional electron gas that is contiguous with the third source contact 650 from the two-dimensional electron gas that is contiguous with the third drain contacts 652.

A fourth gate isolating structure 660 surrounds and separates the first region 638, the second region 640 and the third region 642. The first drain contacts 620, the second drain contacts 634 and the third drain contacts 652 may advantageously be biased to different potentials without incurring undesired leakage currents.

Figure 7:
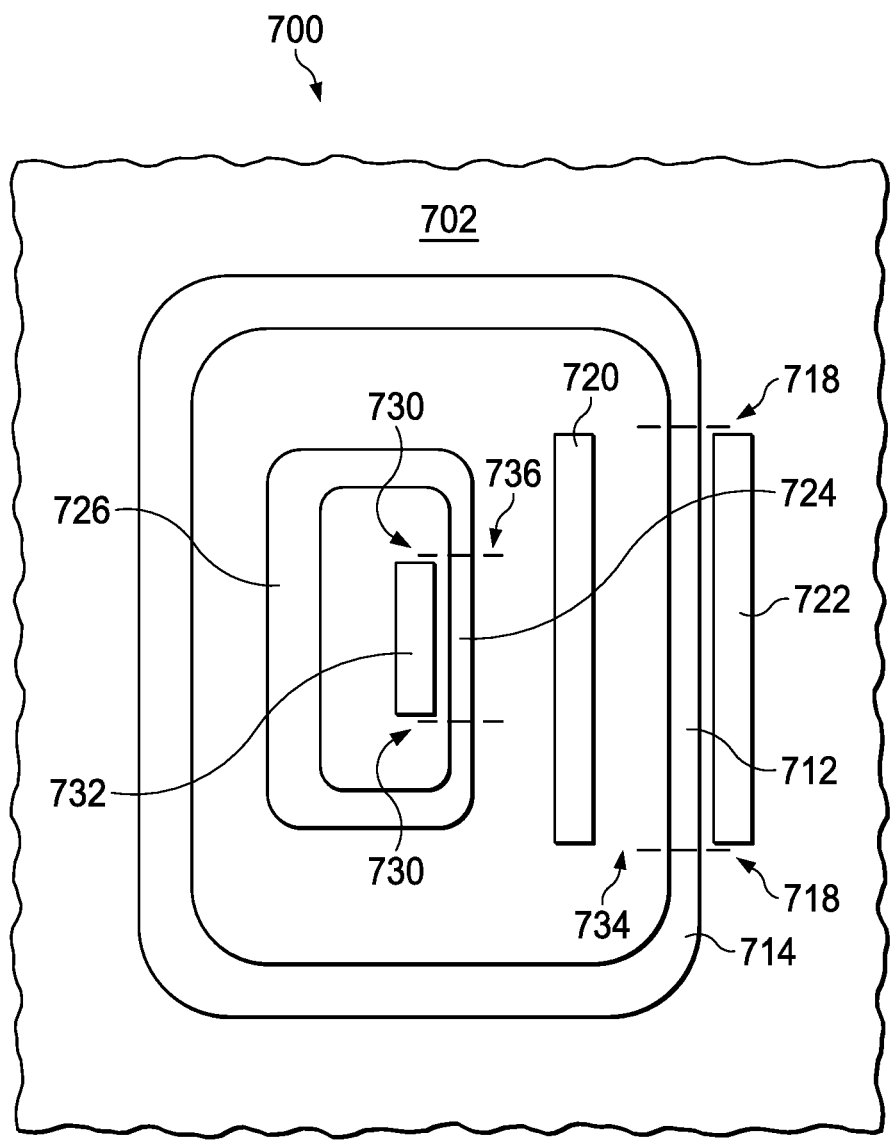

Referring to FIG. 7, a semiconductor device 700 is formed in and on a substrate 702, for example as described in reference to FIG. 1A. A two-dimensional electron gas is formed in the substrate 702 by a barrier layer over an low-defect layer. A first gate 712 and a first gate isolating structure 714 contiguous with the first gate 712 are formed concurrently. A first boundary line 718 delineates the extents of the first gate 712 and the first gate isolating structure 714. The first gate isolating structure 714 surrounds a drain contact 720. A first source contact 722 is formed adjacent to the first gate 712 opposite from the drain contact 720. The first gate 712, the drain contact 720 and the first source contact 722 are parts of a first GaN FET 734 of the semiconductor device 700. The first gate isolating structure 714 electrically isolates the two-dimensional electron gas that is contiguous with the first source contact 722 from the two-dimensional electron gas that is contiguous with the drain contact 720.

A second gate 724 is formed proximate to the drain contact 720 opposite from the first gate 712. A second gate isolating structure 726 is contiguous with the second gate 724 and surrounds a second source contact 732. The second gate 724, the drain contact 720 and the second source contact 732 are parts of a second GaN FET 736 of the semiconductor device 700. A second boundary line 730 delineates the extents of the second gate 724 and the second gate isolating structure 726. The second gate isolating structure 726 surrounds the second source contact 732, so that the two-dimensional electron gas that is contiguous with the second source contact 732 is electrically isolated from the two-dimensional electron gas that is contiguous with the drain contact 720. The first gate isolating structure 714 surrounds the second gate 724 and the second gate isolating structure 726. The second source contact may advantageously be floated or operated at a different potential from the first source contact 722. The second source contact 732 and the second gate 724 may be part of a sense transistor which advantageously senses a drain potential on the drain contact 720 without disrupting current through the first source contact 722.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
a substrate comprising gallium nitride;
a low-defect layer of gallium nitride disposed on said substrate;
a barrier layer of aluminum gallium nitride disposed on said low-defect layer;
a gallium nitride field effect transistor (GaN FET), comprising:
a gate disposed over said barrier layer;
a drain contact disposed over said low-defect layer; and
a source contact disposed over said low-defect layer; and
a first gate isolating structure and a second gate isolating structure disposed over said barrier layer and comprising a same material as said gate, said first gate isolating structure being located between a first region of said semiconductor device and a second region of said semiconductor device and said second gate isolating structure being located between the first region of the semiconductor device and a third region of the semiconductor device, wherein said first gate isolating structure is contiguous with said gate and said second gate isolating structure is separate from said gate.

2. The semiconductor device of claim 1, wherein:
said first region is contiguous with said drain contact; and
said second region is contiguous with said source contact.

3. The semiconductor device of claim 2, wherein:
said GaN FET is a first GaN FET;
said semiconductor device includes a second GaN FET;
said first region is contiguous with said first GaN FET; and
said third region is contiguous with said second GaN FET.

4. The semiconductor device of claim 2, wherein:
said semiconductor device includes an isolation structure; and
said second gate isolating structure extends to and overlaps said isolation structure.

5. The semiconductor device of claim 4, wherein one of said first and said second gate isolating structures surrounds an input/output (I/O) structure.

6. The semiconductor device of claim 4, wherein said second gate isolating structure surrounds said GaN FET.

7. The semiconductor device of claim 4, wherein said first and second gate isolating structures include a metal gate layer.

8. The semiconductor device of claim 4, wherein said gate isolating structure includes a semiconductor gate layer of III-N semiconductor material.

9. The semiconductor device of claim 4, wherein said aluminum gallium nitride comprises indium aluminum gallium nitride.

10. A method of forming a semiconductor device, comprising the steps of:
    providing a substrate comprising gallium nitride;
    forming a low-defect layer of gallium nitride on said substrate;
    forming a barrier layer of aluminum gallium nitride on said low-defect layer;
    forming a GaN FET, by a process comprising the steps of:
        forming a gate over said barrier layer;
        forming a drain contact over said low-defect layer; and
        forming a source contact over said low-defect layer; and
    forming a first gate isolating structure and a second gate isolating structure over said barrier layer concurrently with said gate, said first gate isolating structure being located between a first region of said semiconductor device and a second region of said semiconductor device and the second gate isolating structure located between the first region and a third region of the semiconductor device.

11. The method of claim 10, wherein said first gate isolating structure is contiguous with said gate.

12. The method of claim 11, wherein said second gate isolating structure is separate from said gate.

13. The method of claim 12, wherein:
    said first region is contiguous with said drain contact; and
    said second region is contiguous with said source contact.

14. The method of claim 12, wherein said GaN FET is a first GaN FET, and further including the step of forming a second GaN FET, in which:
    said first region is contiguous with said first GaN FET; and
    said third region is contiguous with said second GaN FET.

15. The method of claim 13, further including the step of forming an isolation structure, and said second gate isolating structure is formed to extend to and overlap said isolation structure.

16. The method of claim 13, wherein said first gate isolating structure surrounds an input/output (I/O) structure.

17. The method of claim 13, wherein said second gate isolating structure surrounds said GaN FET.

18. The method of claim 13, wherein said step of forming said first and second gate isolating structures include forming a metal gate layer.

19. The method of claim 13, wherein said step of forming said first and second gate isolating structures include forming a semiconductor gate layer of III-N semiconductor material.

20. The method of claim 13, wherein said aluminum gallium nitride comprises indium aluminum gallium nitride.

\* \* \* \* \*